(12) United States Patent
Burdine et al.

(10) Patent No.: US 7,089,474 B2
(45) Date of Patent: Aug. 8, 2006

(54) METHOD AND SYSTEM FOR PROVIDING INTERACTIVE TESTING OF INTEGRATED CIRCUITS

(75) Inventors: Todd M. Burdine, Wappingers Falls, NY (US); Franco Motika, Hopewell Junction, NY (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 10/789,710

(22) Filed: Feb. 27, 2004

(65) Prior Publication Data

US 2005/0204237 A1    Sep. 15, 2005

(51) Int. Cl.
*G06F 11/00* (2006.01)
*G06F 17/50* (2006.01)
(52) U.S. Cl. .................. 714/738; 714/741; 703/14
(58) Field of Classification Search ................ None
See application file for complete search history.

(56) References Cited

U.S. PATENT DOCUMENTS

| | | | | | |
|---|---|---|---|---|---|
| 3,761,695 | A | | 9/1973 | Eichelberger | ............... 235/153 |
| 5,991,907 | A | * | 11/1999 | Stroud et al. | ............... 714/725 |
| 6,108,806 | A | * | 8/2000 | Abramovici et al. | ........ 714/725 |
| 6,202,182 | B1 | * | 3/2001 | Abramovici et al. | ........ 714/725 |
| 6,971,054 | B1 | * | 11/2005 | Kurtulik et al. | ............ 714/732 |
| 7,017,095 | B1 | * | 3/2006 | Forlenza et al. | ............ 714/738 |
| 2003/0156549 | A1 | * | 8/2003 | Binder et al. | ............... 370/252 |
| 2004/0010741 | A1 | | 1/2004 | Forlenza et al. | ............ 714/738 |
| 2005/0172188 | A1 | * | 8/2005 | Burdine | ..................... 714/726 |

* cited by examiner

*Primary Examiner*—Phung My Chung
(74) *Attorney, Agent, or Firm*—Lynn Augspurger; Cantor Colburn LLP

(57) ABSTRACT

A method for providing interactive and iterative testing of integrated circuits including the receiving of a first failing region. The first failing region corresponds to one or more circuits on the integrated circuit. The method generates a set of adaptive algorithmic test patterns for the one or more circuits in response to the first failing region and to a logic model of the integrated circuit. Expected results for the test patterns are determined. The method includes applying the test patterns to the first failing region on the integrated circuit resulting in actual results for the test patterns. The expected results to the actual results are compared. The method also transmits mismatches between the expected results and the actual results to a fault simulator. The method includes receiving a second failing region from the fault simulator, the second failing region created in response to the mismatches and the logic model, and the second failing region corresponding to a subset of the one or more circuits on the integrated circuit.

20 Claims, 4 Drawing Sheets

| A | B | Z expect | Z actual |
|---|---|---|---|
| 0 -> 0 | 0 -> 0 | 0 | 0 |
| 0 -> 0 | 0 -> 1 | 1 | 1 |
| 0 -> 0 | 1 -> 0 | 0 | 0 |
| 0 -> 0 | 1 -> 1 | 1 | 1 |
| 0 -> 1 | 0 -> 0 | 1 | 1 |
| 0 -> 1 | 0 -> 1 | 1 | 0 |
| 0 -> 1 | 1 -> 0 | 0 | 0 |
| 0 -> 1 | 1 -> 1 | 0 | 0 |
| 1 -> 0 | 0 -> 0 | 0 | 0 |
| 1 -> 0 | 0 -> 1 | 1 | 1 |
| 1 -> 0 | 1 -> 0 | 0 | 0 |
| 1 -> 0 | 1 -> 1 | 1 | 1 |
| 1 -> 1 | 0 -> 0 | 1 | 1 |
| 1 -> 1 | 0 -> 1 | 0 | 0 |
| 1 -> 1 | 1 -> 0 | 1 | 0 |
| 1 -> 1 | 1 -> 1 | 0 | 0 |

METHOD AND SYSTEM FOR PROVIDING INTERACTIVE TESTING OF INTEGRATED CIRCUITS

BACKGROUND OF THE INVENTION

The invention relates to testing integrated circuits and in particular to a diagnostic utility for identifying defects and test pattern sensitivities in semiconductor logic.

Several design, test and diagnostic methodologies have evolved over the years in support of structural and functional test methods. Some of the integrated circuit designs integrate this support onto the device itself. These built-in self-test (BIST) and diagnostic functions are based on several design for test (DFT) techniques such as scan design (e.g., level sensitive scan design (LSSD) and general scan design (GSD)), logic and array built-in-self-test (LBIST and ABIST), on-product clock generation (OPCG), and others.

The LSSD test and diagnostic methodology has been widely used for many years. It is based on the concept of "divide-and-conquer" whereby large sequential logic structures are divided into smaller combinatorial partitions. The LSSD methodology is a system design and a DFT approach that incorporates several basic test concepts (e.g., scan design). In such a design most of the device's storage elements, such as latches or registers, are concatenated into one or more scan chains that are externally accessible via one or more serial inputs and outputs. Storage elements that are not in this category are usually memory or other special macros that are isolated and can be tested independently. The LSSD design methodology ensures that all logic feedback paths incorporate one or more of these concatenated storage elements, thereby simplifying a sequential design into subsets of combinational logic sections.

These basic design concepts in conjunction with the associated system and scan clocking sequences, greatly simplify the test generation, testing, and the diagnosing of complex logic structures. In such a design, every latch can be used as a pseudo primary input and as a pseudo primary output, in addition to the standard primary inputs and standard primary outputs, to enhance the stimulation and observability of the device being tested or diagnosed. Typically, LSSD latches are implemented in a configuration having master (L1) and slave (L2) latches where each master latch (L1) has two data ports that may be updated by either a scan clock or a functional clock, and each slave latch (L2) has one clock input that is out of phase with both the L1 scan and functional clocks. Scanning is performed using separate A and B scan clocks.

The strategy of diagnosing these LSSD circuits has been established and evolving for many years. The primary characteristic of deterministic or pre-determined LSSD patterns is that each pattern is independent from every other pattern and each pattern consists of stimulating primary inputs, clocking, load and unload of shift register latches, and primary outputs measure sequence. Such LSSD circuits may have thousands of patterns depending upon the size and structure of the logic. During diagnostics, one or more failing patterns are identified and fault simulation is performed on the failing pattern (load, primary inputs, system clocks, and unload sequence). The circuit states can be determined by analyzing and simulating the failing pattern load, primary inputs, system clocks and measures. Passing patterns may also be used to eliminate potential faults that the identified failing patterns marked as potential candidates.

Identifying the fault and pinpointing the root cause of the problem in large logic structures requires high resolution diagnostic calls. The high resolution diagnostic calls help to localize the defect(s), and to complete the physical failure analysis (PFA) defect localization. The resolution of current logic diagnostic algorithms and techniques depends on the number of tests and the amount of passing and failing test data available for each fault. A problem often encountered in testing, and the subsequent diagnosis, of very large-scale integration (VLSI) devices is the availability of effective test patterns for a broad range of modeled and un-modeled faults. The rapid integration growth of VLSI devices, associated high circuit performance, and complex semiconductor processes has intensified old and introduced new types of defects. This defect diversity and subtlety, accompanied by limited fault models, usually results in large, insufficient and ineffective diagnostic pattern sets. The results determined by the fault simulators are typically imperfect, in that they contain several (in many cases dozens) diagnostic calls that may need to be investigated in order to pinpoint the cause(s) of the failure.

BRIEF SUMMARY OF THE INVENTION

One aspect of the invention is a method for testing an integrated circuit. The method includes receiving a first failing region. The first failing region corresponds to one or more circuits on the integrated circuit. A set of adaptive algorithmic test patterns is generated for the one or more circuits in response to the first failing region and to a logic model of the integrated circuit. Expected results for the test patterns are determined by simulation or from actual "good" devices. The method also includes applying the test patterns to the first failing region on the integrated circuit resulting in actual results for the test patterns. The expected results are compared to the actual results. Mismatches between the expected results and the actual results are transmitted to a fault simulator. A second failing region is received from the fault simulator, where the second failing region was created in response to the mismatches and the logic model. The second failing region corresponds to a subset of the one or more circuits on the integrated circuit.

Another aspect of the invention is a computer program product for testing an integrated circuit. The computer program product includes a storage medium readable by a processing circuit and storing instructions for execution by the processing circuit for performing a method that includes receiving a first failing region. The first failing region corresponds to one or more circuits on the integrated circuit. A set of algorithmic test patterns for the one or more circuits is generated in response to the first failing region and to a logic model of the integrated circuit. The method determines expected results for the test patterns. The test patterns are applied to the first failing region on the integrated circuit resulting in actual results for the test patterns. The expected results are compared to the actual results. Mismatches between the expected results and the actual results are transmitted to a fault simulator. A second failing region is received from the fault simulator, where the second failing region was created in response to the mismatches and the logic model. The second failing region corresponds to a subset of the one or more circuits on the integrated circuit.

A further aspect of the invention is a system for testing an integrated circuit. The system includes a programmable pattern generator. The system also includes a bootstrapping module that is in communication with the integrated circuit. A test controller is in communication with the programmable pattern generator, the bootstrapping module, the integrated circuit, and a fault simulator. The fault simulator includes a logic model of the integrated circuit. The test controller includes instructions to execute a method that includes receiving a first failing region. The first failing region corresponds to one or more circuits on the integrated circuit. A set of algorithmic test patterns is generated by the programmable pattern generator for the one or more circuits in response to the first failing region and to the logic model. The expected results for the test patterns are determined and captured by the bootstrapping module. The test patterns are applied to the first failing region on the integrated circuit resulting in actual results for the test patterns. The bootstrapping module captures the actual expected results and the expected results which are compared to the actual failing results. Mismatches between the expected results and the actual results are transmitted to the fault simulator. A second failing region is received from the fault simulator, where the second failing region was created in response to the mismatches and the logic model. The second failing region corresponds to a subset of the one or more circuits on the integrated circuit. The process can be iterative in nature.

BRIEF DESCRIPTION OF THE DRAWINGS

Referring now to the drawings wherein like elements are numbered alike in the several FIGURES.

DETAILED DESCRIPTION OF THE PREFERRED EMBODIMENTS

An exemplary embodiment of the present invention includes a novel test, characterization and diagnostic method applicable to logic designs. It addresses the problems of fault isolation and diagnostic resolution by providing an adaptive test algorithm and a tester interactive pattern generator method in conjunction with on-the-fly bootstrapping techniques. The test and diagnostic method is used to identify defects and pattern sensitivities within a specific logic partition. This is accomplished by applying a pre-determined set of patterns to the logic in both an operating region and a failing region. The bootstrapped results from the operating region are compared to the results in the failing region to determine if the pattern passes or fails. In alternate exemplary embodiments, the basic concept is further extended to encompass interactively simulated patterns to optimize the diagnostic convergence process. Also, in situations where a "passing" operation region is not readily available, the good machine simulated (GMS) expected values may be utilized instead of the bootstrapping technique.

Once an initial set of failing patterns has been identified, the process is reiterated until the desired diagnostic resolution is achieved. This adaptive and interactive test method may invoke additional on-the-fly pattern generations, simulation of some of these patterns, and modification of test setup condition when required to focus on a specific logic area, or region, of interest. This interactive and adaptive test process results in an empirical, but highly effective diagnostic methodology based on dynamic pattern generation algorithms.

Figure 1:
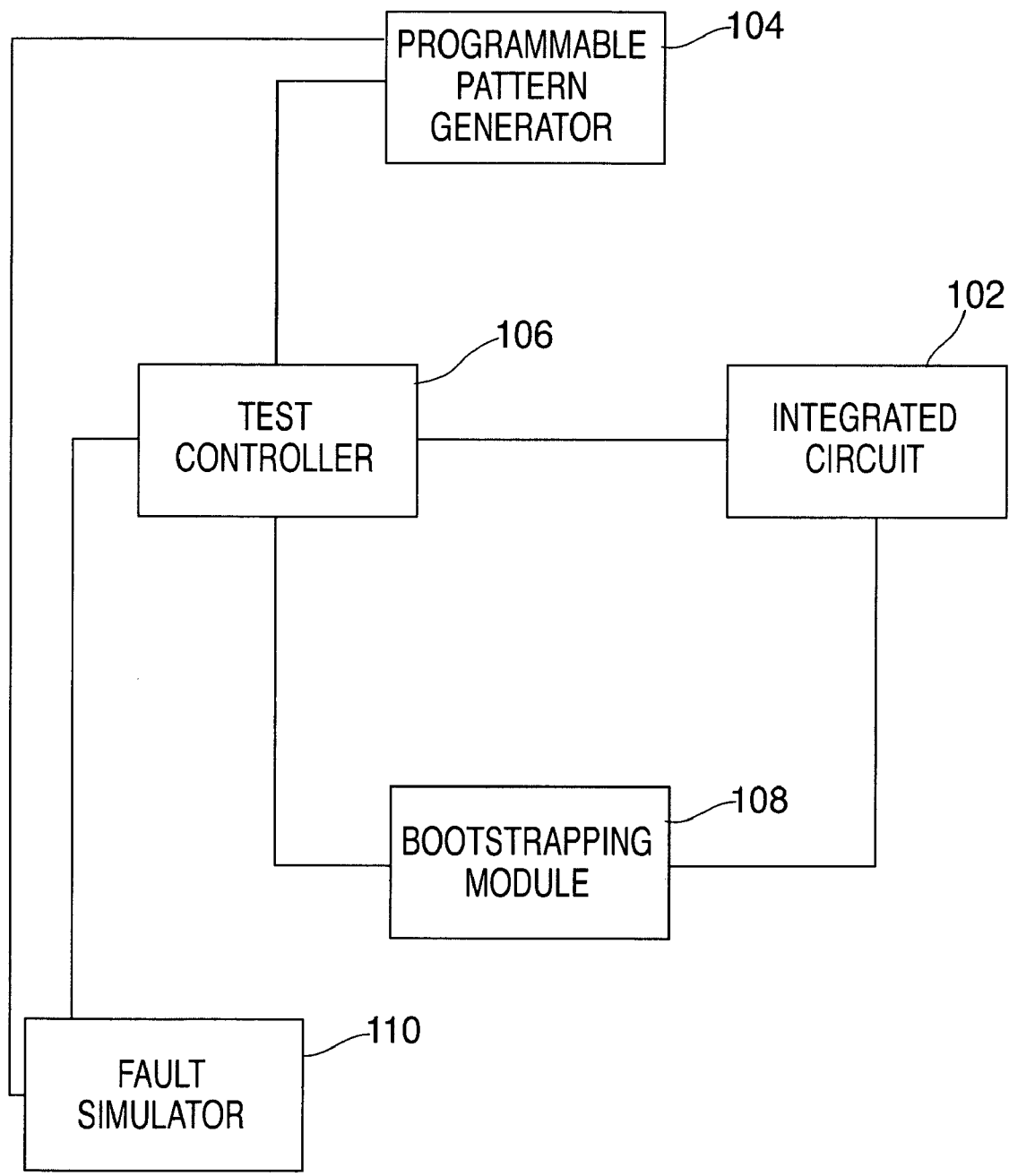
FIG. 1 is a block diagram of an exemplary system for providing interactive testing of integrated circuits.

Referring to FIG. 1, an exemplary embodiment of the present invention includes a programmable pattern generator 104, an on-the-fly bootstrapping module 108, and a test controller 106. The test controller 106, bootstrapping module 108 and programmable pattern generator 104 communicate with each other and also with an integrated circuit 102 and a fault simulator 110. The programmable pattern generator 104 and the fault simulator 110 are also in communication with each other. These modules may be physically located in the same hardware and/or software system or they may be located in different hardware and/or software systems. In addition, one module may be located in a geographically distinct location from another module. The modules may communicate via any manner known in the art including, but not limited to, a direct connection and a network connection (e.g., LAN, Internet, intranet).

The programmable pattern generator 104 is programmed to generate a specific set of algorithmic patterns, such as walk, march, checkerboard, and exhaustive, to list a few. Additional extended pattern sets may include deterministic (target a specific fault), pseudo-random, functional, and other combinations of adaptive and interactively generated patterns. Some examples of the basic patterns follow:

| | | | | |
|---|---|---|---|---|
| Walk | 1000 → | 0100 → | 0010 → | 0001 |
| March | 1000 → | 1100 → | 1110 → | 1111 |
| Checkerboard | 10000000 → | 10100000 → | 10101000 → | 10101010 |
| | 01000000 → | 01010000 → | 01010100 → | 01010101 |
| | 01111111 → | 01011111 → | 01010111 → | 01010101 |
| | 10111111 → | 10101111 → | 10101011 → | 10101010 |

Exhaustive   000 → 001 → 010 → 011 → 100 → 101 → 110 → 111

The test controller 106 controls the sequence of events that occur. The first pattern in the desired sequence is applied to logic in the integrated circuit 102 (e.g., via a scan chain load) in the operating region. The operating region is a portion of the integrated circuit 102 that is working properly, as identified by previous tests. The operating region may have different characteristics, or conditions, than the failing region (e.g., higher/lower voltage, slower/faster cycle time, higher/lower temperature). If the integrated circuit 102 does not have an operating region, then another integrated circuit with an operating region or a logic simulator may be utilized to create expected results for the pattern. The test controller 106 sends a signal to the integrated circuit 102 to apply the system clocks and the "expected" results are captured by the bootstrapping module 108 (e.g., for LSSD it unloads part or all of the scan chain). The same pattern and system clock sequence are then applied in the failing region of the integrated circuit 102, and the actual failing results from the failing region are compared to the expected "good" results by the test controller 106. If the test results match, the current pattern passed, and if the results are different, the current pattern failed and the failing results are logged. The test controller 106 then signals the programmable pattern generator 104 to generate the next pattern. This process repeats for each pattern in the pattern algorithm set.

Figure 2:
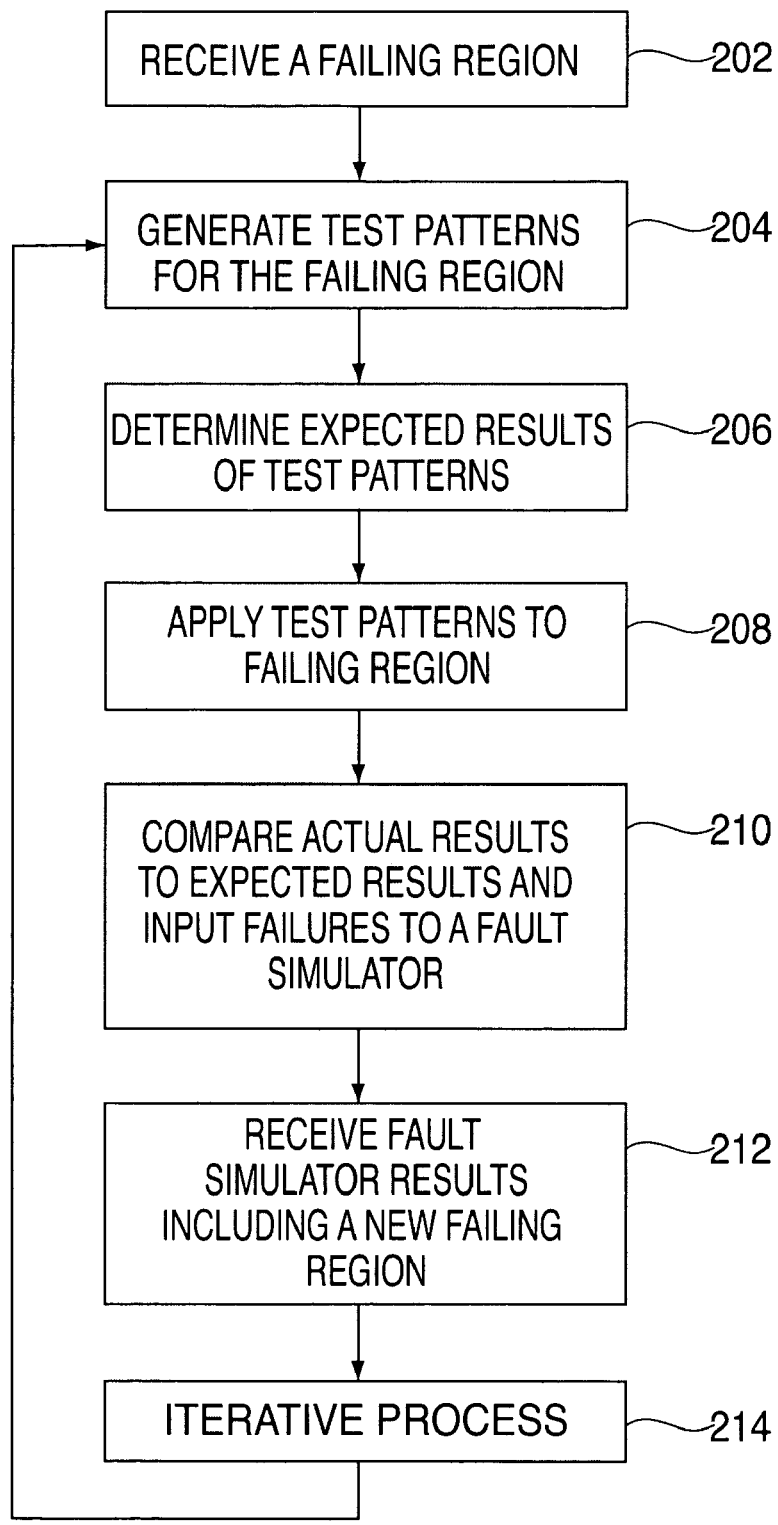
FIG. 2 is a flow diagram of a process for providing interactive testing of integrated circuits utilizing an exemplary embodiment of the present invention.

FIG. 2 is a flow diagram of a process for providing interactive testing of integrated circuits utilizing an exemplary embodiment of the present invention. At step 202, a failing region is identified. In an exemplary embodiment of the present invention, the failing region is identified from a fault simulator. A region identifies one or more circuits, or a logic partition, on the integrated circuit 102. The failing region may be identified during initial testing or during a previous interactive test. The specific region being tested may include fewer circuits as iterations of the interactive testing are performed and as the cause of the error is localized or pinpointed to specific circuitry within the integrated circuit 102. At step 204, a set of algorithmic test patterns for the failing region are generated by the adaptive and programmable pattern generator 104 in response to instructions from the test controller 106. As discussed previously, these algorithmic test patterns may include patterns such as walk, march, checkerboard, and exhaustive. A typical algorithm is to first apply walk 0, walk 1, march 0, and march 1 patterns to the failing circuit(s). If certain bits cause the fail to appear or disappear at a certain state, the next step is to hold those bits at the state and walk/march the other bits. Continuing this process can quickly lead to the fail. If the walk and march patterns do not stimulate the circuit, checkerboard and random pattern can be applied next. If the number of inputs to the circuit is relatively small, an exhaustive set of patterns can be applied to pinpoint the fault in one step.

At step 206, the expected results of the test pattern set are determined. They may be determined by applying the test patterns to a region of the integrated circuit 102 that is known to operate without errors (e.g., an operating region). If there is no known operating region on the integrated circuit 102, a region on another integrated circuit may be utilized. This method of obtaining actual good machine responses is referred to as the "bootstrapping" technique. Alternatively, a logic simulator may also be utilized to determine the expected results of the test patterns. At step 208, the test patterns are applied to the failing region on the integrated circuit 102 to create actual results. The actual results are compared to the expected results at step 210, and the mismatches, or failing patterns, are input to a fault simulator 110. At step 212, the results from the fault simulator are received including a new failing region. The new failing region may include fewer circuits than the failing region received at step 202 because another iteration of the testing has been performed and the error is being further pinpointed.

The test process depicted in FIG. 2 may be performed iteratively, as noted in step 214, until the error has been sufficiently pinpointed and described. This may mean that the process is performed until the fault simulator 110 outputs less than a specified number of diagnostic calls. Alternatively, the process may be performed until the failing region has less than a specified number of gates. Another alternative is to have the process performed a selected number of times (e.g., one, two, ten). The number of times the process is performed may be dependent on the complexity of the circuit being tested with complex integrated circuits requiring more iterations than less complex integrated circuits. In addition, the integrated circuit 102 may have several failing regions and the test process performed in FIG. 2 may be automatically performed for each failing region.

Figure 3:
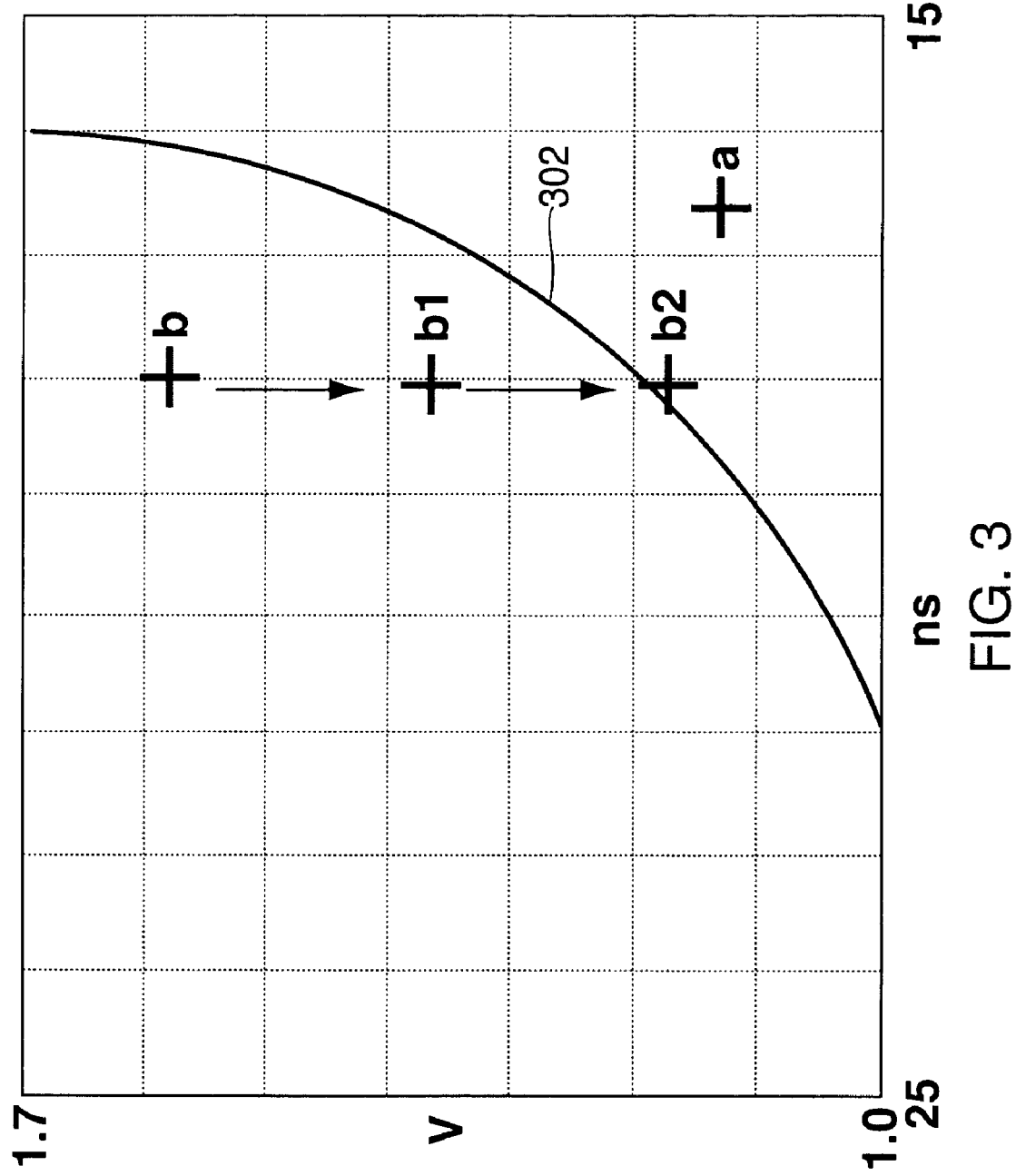
FIG. 3 is a plot of sample test results that depicts how a particular test passes or fails when voltage and speed conditions are varied.

In an exemplary embodiment of the present invention, the test controller 106 repeats each test until a minimum and/or maximum failing condition is found for the failing region. In this manner, the sensitivity of the error to particular conditions may be tested, characterized and isolated. For example, the test may be repeated until the minimum and/or maximum failing voltage or minimum and/or maximum failing temperature or minimum and/or maximum failing rate (frequency) is determined. FIG. 3 is a typical schmoo plot of sample test results that depicts how a particular test passes or fails when the voltage and speed conditions are varied. To the right of line 302 is the failing region of the integrated circuit 102 and to the left of the line 302 is the operating or passing region. The test process described in reference to FIG. 2 would be repeated in incremental steps from point "b" to point "b2" by varying the voltage on the integrated circuit 102 before performing the test process. Point "b2" is determined to be the minimum passing voltage at the given frequency. This option may be useful to identify the patterns that the logic partition, or region, is most sensitive to. The incremental steps may be performed automatically with the test process ending when the minimum and/or maximum failing condition is determined.

Figure 4:
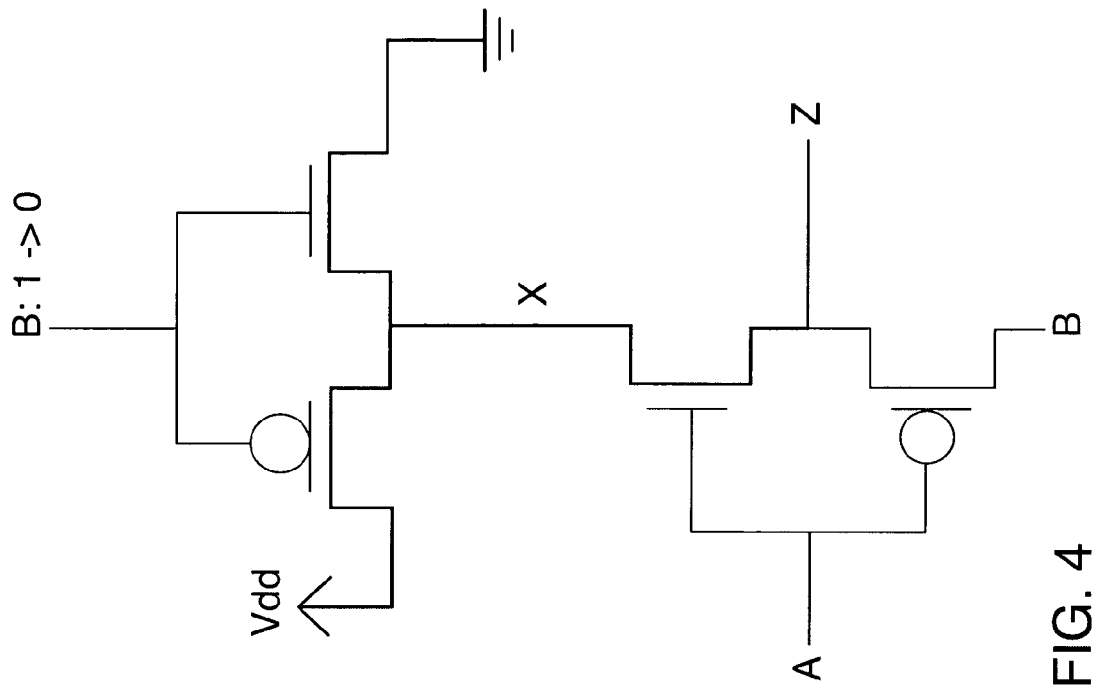
FIG. 4 is a sample logic table and circuit diagram for an exclusive-or gate.

By applying an exhaustive set of patterns and recording which patterns pass and fail, the logic model may be traced out to pinpoint the defect. For example, consider an exclusive-OR gate with inputs "A" and "B". FIG. 4 is a sample logic table and circuit diagram, including transitors, for a sample exclusive-OR gate. Applying all possible transitions (0→0, 0→1, 1→0, and 1→1) on each of the two inputs results in sixteen possible pattern combinations. If patterns [A:0→1, B:1→0] and [A:1→1, B:1→0] are the only two patterns which cause the logic gate to fail, the defect can be determined to be a slow-to-turn-off N-FET on the B-input. Although the above example consists of a simple logic circuit, the concept can be extended to complex logic structures.

In scan based testing it may not be always possible to apply an exhaustive pattern set to a logic partition because of latch adjacency. For example, A 0→1 transition cannot be applied on two adjacent scan chain latches because in LSSD scan designs, the final state of a latch is the initial state of the previous latch. However, performing a parallel load can resolve this problem in many instances. During a parallel load, the L1 latches are loaded from the scan chain, and the L2 latches are loaded from the system ports.

Exemplary embodiments of the present invention may be utilized with combinational and sequential logic circuits. This can be applied to any functional circuit/device. Non-LSSD devices can be tested via the I/O, although the number of patterns that would have to be generated would be numerous on a large-scale device.

Exemplary embodiments of the present invention provide a highly interactive and adaptive test process that results in an empirical, but effective diagnostic methodology based on dynamic pattern generation algorithms. Particular logic regions may be identified as failing regions and then exhaustively tested to pinpoint the source of the error. Exemplary embodiments of the present invention may be utilized to interactively test non-modeled faults, alternating current (AC) faults, net-to-net defects and pattern sensitive faults by varying the algorithmic patterns applied to the failing region of the integrated circuit 102. In addition, exemplary embodiments of the present invention support functional test and structural test methodology convergence by adapting the interactive pattern generation to functional subsets of patterns. Exhaustive AC and direct current (DC) sequences on logic partitions may be performed, excluding latch adjacency. In addition, exemplary embodiments of the present invention are highly interactive and convergent and support multiple predefined algorithmic pattern sequences and adaptive testing sequences.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. An embodiment of the present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A method for testing an integrated circuit, the method comprising:
   receiving a first failing region, the first failing region corresponding to one or more circuits on the integrated circuit;
   generating a set of adaptive algorithmic test patterns for the one or more circuits in response to the first failing region and to a logic model of the integrated circuit;
   determining expected results for the test patterns;
   applying the test patterns to the first failing region on the integrated circuit resulting in actual results for the test patterns;
   comparing the expected results to the actual results;
   transmitting mismatches between the expected results and the actual results to a fault simulator; and
   receiving a second failing region from the fault simulator, the second failing region created in response to the mismatches and the logic model, and the second failing region corresponding to a subset of the first failing region.

2. The method of claim 1 wherein the first failing region is identified from the fault simulator.

3. The method of claim 1 wherein the generating, determining, applying, comparing, transmitting and receiving a second failing region are repeated with the value of the second failing region being substituted for the first failing region, until the second failing region corresponds to a failing gate.

4. The method of claim 1 wherein the generating, determining, applying, comparing, transmitting and receiving a second failing region are repeated with the value of the second failing region being substituted for the first failing region, a selected number of times.

5. The method of claim 1 further comprising receiving one or more diagnostic classes corresponding to the second failing region from the fault simulator, wherein the generating, determining, applying, comparing, transmitting, receiving a second failing region and receiving one or more diagnostic classes are repeated with the value of the second failing region being substituted for the first failing region, until less than a selected number of diagnostic classes are received for the second failing region.

6. The method of claim 1 further comprising receiving one or more conditions corresponding to the first failing region from the fault simulator, wherein the generating, determining, applying, comparing, transmitting and receiving a second failing region are repeated with the value of the conditions being varied.

7. The method of claim 6 wherein the conditions include one or more of voltage, cycle and temperature.

8. The method of claim 1 wherein determining expected results is performed by executing an operating region corresponding to the failing region in the integrated circuit that was identified during initial testing.

9. The method of claim 1 wherein determining expected results is performed by executing an operating region corresponding to the failing region in another integrated circuit.

10. The method of claim 1 wherein determining expected results is performed by executing a simulation corresponding to the failing region.

11. The method of claim 1 wherein the set of algorithmic test patterns include one or more of walk, march, checkerboard and exhaustive.

12. The method of claim 1 wherein the set of algorithmic test patterns are characterized as one or more of deterministic, pseudo-random and functional.

13. A computer program product for testing an integrated circuit, the computer program product comprising:
   a storage medium readable by a processing circuit and storing instructions for execution by the processing circuit for performing a method comprising:
      receiving a first failing region, the first failing region corresponding to one or more circuits on the integrated circuit;
      generating a set of adaptive algorithmic test patterns for the one or more circuits in response to the first failing region and to a logic model of the integrated circuit;
      determining expected results for the test patterns;
      applying the test patterns to the first failing region on the integrated circuit resulting in actual results for the test patterns;
      comparing the expected results to the actual results;
      transmitting mismatches between the expected results and the actual results to a fault simulator; and
      receiving a second failing region from the fault simulator, the second failing region created in response to the mismatches and the logic model, and the second failing region corresponding to a subset of the one or more circuits on the integrated circuit.

14. The storage medium of claim 13 wherein the generating, determining, applying, comparing, transmitting and receiving a second failing region are repeated with the value of the second failing region being substituted for the first failing region, until the second failing region corresponds to a failing gate.

15. The storage medium of claim 13 wherein the generating, determining, applying, comparing, transmitting and receiving a second failing region are repeated with the value of the second failing region being substituted for the first failing region, a selected number of times.

16. The storage medium of claim 13 further comprising receiving one or more diagnostic classes corresponding to the second failing region from the fault simulator, wherein the generating, determining, applying, comparing, transmitting, receiving a second failing region and receiving one or more diagnostic classes are repeated with the value of the second failing region being substituted for the first failing region, until less than a selected number of diagnostic classes are received for the second failing region.

17. The storage medium of claim 13 further comprising receiving one or more conditions corresponding to the first failing region from the fault simulator, wherein the generating, determining, applying, comparing, transmitting and receiving a second failing region are repeated with the value of the conditions being varied.

18. A system for testing an integrated circuit, the system comprising:
 a programmable pattern generator;
 a bootstrapping module in communication with the integrated circuit; and
 a test controller in communication with the programmable pattern generator, the bootstrapping module, the integrated circuit and a fault simulator including a logic model of the integrated circuit, the test controller including instructions to execute the method comprising:
  receiving a first failing region, the first failing region corresponding to one or more circuits on the integrated circuit;
  generating a set of adaptive algorithmic test patterns for the one or more circuits in response to the first failing region and to the logic model, wherein the algorithmic test patterns are created by the programmable pattern generator;
  determining expected results for the test patterns, wherein the expected results are captured by the bootstrapping module;
  applying the test patterns to the first failing region on the integrated circuit resulting in actual results for the test patterns, wherein the actual results are captured by the bootstrapping module;
  comparing the expected results to the actual results;
  transmitting mismatches between the expected results and the actual results to the fault simulator; and
  receiving a second failing region from the fault simulator, the second failing region created in response to the mismatches and the logic model, and the second failing region corresponding to a subset of the one or more circuits on the integrated circuit.

19. The system of claim 18 wherein the integrated circuit is a level sensitive scan design device.

20. The system of claim 18 wherein the integrated circuit is a very large-scale integration device.

* * * * *